(12) United States Patent
Andre et al.

(10) Patent No.: US 10,658,013 B2
(45) Date of Patent: May 19, 2020

(54) FEED FORWARD BIAS SYSTEM FOR MTJ VOLTAGE CONTROL

(71) Applicant: Everspin Technologies, Inc., Chandler, AZ (US)

(72) Inventors: Thomas Andre, Austin, TX (US); Syed M. Alam, Austin, TX (US); Frederick Neumeyer, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/252,067

(22) Filed: Jan. 18, 2019

(65) Prior Publication Data

US 2019/0221242 A1    Jul. 18, 2019

Related U.S. Application Data

(60) Provisional application No. 62/618,666, filed on Jan. 18, 2018.

(51) Int. Cl.

| | |
|---|---|
| *G11C 5/14* | (2006.01) |
| *G11C 11/16* | (2006.01) |
| *H01L 43/08* | (2006.01) |
| *H01L 27/22* | (2006.01) |
| *G11C 29/02* | (2006.01) |
| *G11C 29/50* | (2006.01) |

(52) U.S. Cl.
CPC .......... *G11C 5/147* (2013.01); *G11C 11/1659* (2013.01); *G11C 11/1673* (2013.01); *G11C 11/1675* (2013.01); *G11C 29/021* (2013.01); *G11C 29/028* (2013.01); *H01L 27/224* (2013.01); *H01L 27/228* (2013.01); *H01L 43/08* (2013.01); *G11C 2029/5006* (2013.01)

(58) Field of Classification Search
CPC ............ G11C 11/1659; G11C 11/1675; G11C 11/1673
USPC ......................................... 365/158, 171, 173
See application file for complete search history.

(56) References Cited

U.S. PATENT DOCUMENTS

| | | | |
|---|---|---|---|
| 8,929,132 B2 | 1/2015 | Alam et al. | |
| 9,183,912 B2 | 11/2015 | Gogl et al. | |
| 2008/0310218 A1* | 12/2008 | Hachino | ................. G11C 11/15 365/171 |
| 2013/0329489 A1* | 12/2013 | Kim | .................... G11C 11/1659 365/158 |

* cited by examiner

*Primary Examiner* — Han Yang
(74) *Attorney, Agent, or Firm* — Bookoff McAndrews, PLLC (57) ABSTRACT

The present disclosure is drawn to, among other things, a magnetic memory. The magnetic memory comprises a first common line, a second common line, and a memory cell. The magnetic memory further includes a bias voltage generation circuit and a voltage driver. The bias voltage generation circuit and the voltage driver are configured to provide driving voltages to the memory cell during access operations.

18 Claims, 5 Drawing Sheets

FEED FORWARD BIAS SYSTEM FOR MTJ VOLTAGE CONTROL

CROSS-REFERENCE TO RELATED APPLICATIONS

This application claims the benefit of priority from U.S. Provisional Application No. 62/618,666, filed on Jan. 18, 2018, which is incorporated by reference herein in its entirety.

TECHNICAL FIELD

The disclosure herein relates generally to magnetic memory devices, and, more particularly, to circuits and methods for generating bias voltages in such memory devices.

INTRODUCTION

Spin-torque magnetic memory devices store information by controlling the resistance across a magnetic tunnel junction (MTJ) such that a read current through the magnetic tunnel junction results in a voltage drop having a magnitude that is based on the state of the magnetoresistive stack. The resistance in each magnetic tunnel junction can be varied based on the relative magnetic states of the magnetoresistive layers within the magnetoresistive stack. In such memory devices, there is typically a portion of magnetoresistive stack that has a fixed magnetic state and another portion that has a free magnetic state that is controlled to be either one of two possible states relative to the portion having the fixed magnetic state. Because the resistance through the magnetic tunnel junction changes based on the orientation of the free portion relative to the fixed portion, information can be stored by setting the orientation of the free portion. The information is later retrieved by sensing the orientation of the free portion. Such magnetic memory devices are well known in the art.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved.

In the interest of conciseness, conventional techniques, structures, and principles known by those skilled in the art may not be described herein, including, for example, standard semiconductor process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in or otherwise contemplated with respect to an embodiment of described the subject matter.

Writing to magnetic memory cells can be accomplished by sending a spin-polarized write current through the memory cell where the angular momentum carried by the spin-polarized current can change the magnetic state of the free portion of the magnetic tunnel junction. One of ordinary skill in the art understands that such a current can either be directly driven through the memory cell or can be the result of applying one or more voltages, where the applied voltages result in the desired current. Depending on the direction of the current through the memory cell, the resulting magnetization of the free portion will either be parallel or antiparallel to the fixed portion. If the parallel orientation represents a logic "0", the antiparallel orientation represents a logic "1", or vice versa. Thus, the direction of write current flow through the memory cell determines whether the memory cell is written to a first state or a second state. In such memories, the magnitude of the write current is typically greater than the magnitude of a read current used to sense the information stored in the memory cells.

Each memory cell typically includes a magnetic tunnel junction coupled in series with a corresponding selection transistor that allows each memory cell to be individually selected for access. In some architectures, each memory cell is coupled between two common lines, which are often referred to as a bit line and a source line. A memory array typically includes many bit lines and source lines that allow selective access to subsets of the memory cells within the array. Word lines are coupled to the gates of the selection transistors, thereby controlling current flow through the series circuit of each memory cell based on the voltages applied to the ends of the magnetic memory cell by, for example, the bit lines and source lines.

The voltages that are applied to the ends of the magnetic memory cell can be applied, for example, by MOS-follower circuitry. Such MOS-follower circuitry can include an NMOS-follower for providing greater (high) voltages or a PMOS-follower for providing lesser (low) voltages. In the example of NMOS-follower circuitry, the voltage applied to the gate of an NMOS-follower transistor determines the voltage applied at one end of the magnetic memory cell. The use of NMOS-follower circuitry to supply the appropriate voltage to the magnetic memory cell is described in detail in U.S. Pat. No. 8,929,132, which is incorporated by reference herein in its entirety.

Embodiments of the present disclosure related to, among other things, circuitry configured to generate bias voltages for magnetic memory devices. The generation of the bias voltage that is to be applied to the gate of the NMOS-follower circuitry driving one end of the magnetic memory cell can be accomplished using the prior art circuitry illustrated in FIG. 1. U.S. Pat. No. 9,183,912 provides more detail with respect to the prior art bias circuitry shown in FIG. 1 and is incorporated by reference herein in its entirety. While providing accurate biasing for the driver circuits in the magnetic memory, the circuitry shown in FIG. 1 includes a large number of components that take up additional die area. The operational amplifiers 20 supporting the closed-loop bias system also have quiescent current draw that is undesirable from a power consumption perspective.

Figure 1:
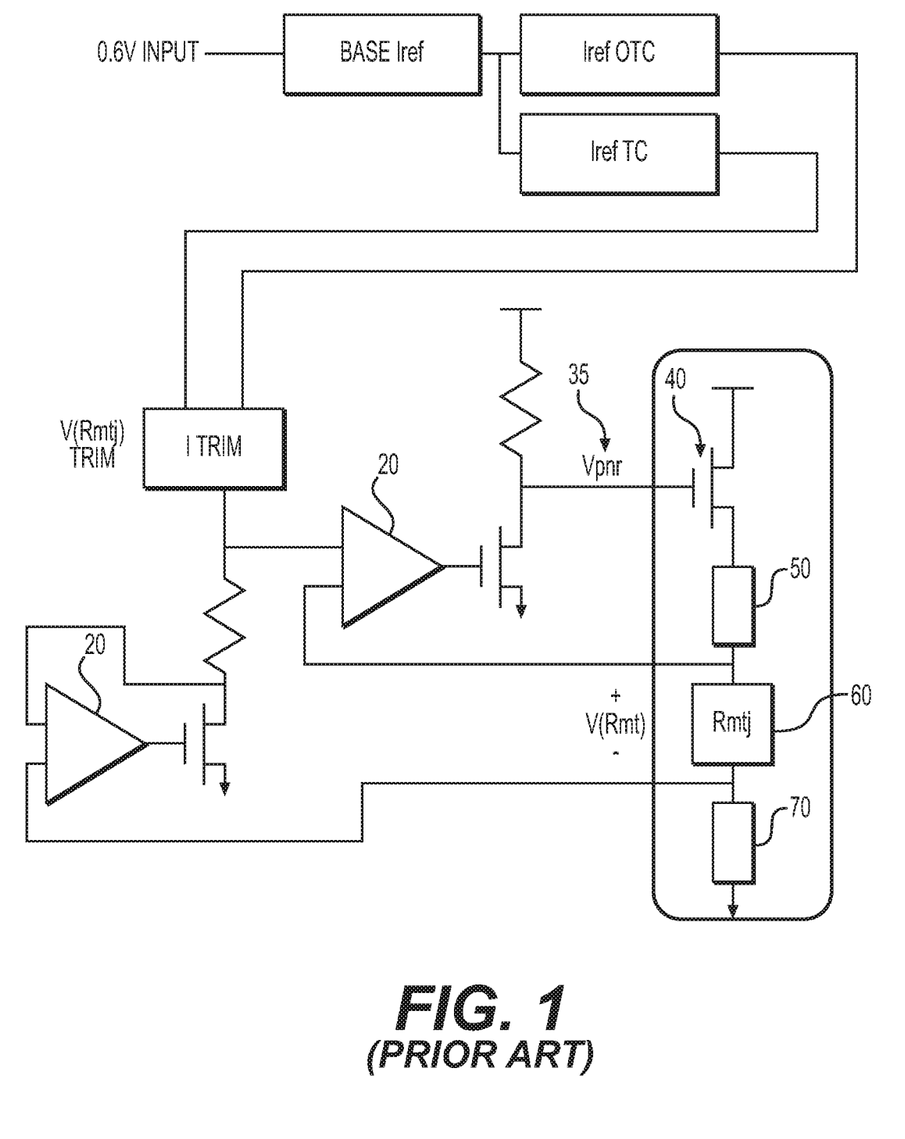
FIG. 1 depicts a schematic diagram of a bias voltage generation circuit, according to one aspect of the present disclosure.

In the circuit of FIG. 1, Rmtj 60 represents a resistance value corresponding to a magnetic tunnel junction in the memory cell. In some embodiments, Rmtj 60 may be a dummy magnetic tunnel junction, whereas in other embodiments, Rmtj 60 may be a resistor having the appropriate resistance for using in place of a dummy magnetic tunnel junction. Note that the resistance chosen may, for example, correspond to the resistance of a magnetic tunnel junction storing a high state, the resistance of a magnetic tunnel junction storing a low state, or some resistance in between those to values. Coupling devices 50 and 70 above and below Rmtj 30 correspond to column select circuits, grounding devices (e.g. coupling device 40a may correspond to a transistor that couples the bottom-end of Rmtj 30 to ground), or other aspects of circuitry used in the sensing circuit of the memory that reads data from the memory cells. These coupling devices are intended to mimic the characteristics of those circuit components, and may be implemented with replica transistors or appropriately valued resistors or other circuit components.

The voltage drop across Rmtj 60 bin FIG. 1 is fed back to a closed loop regulation system that generates bias voltage Vpnr 35 that is fed to NMOS-follower transistor 40. Bias voltage Vpnr 35 affects the voltage applied to the top end of Rmtj 60, and hence across the dummy magnetic tunnel junction. The feedback loop allows for generation of an appropriate Vpnr voltage level in the dummy circuit, where that bias voltage is then supplied to the array sensing circuits used to read data from the memory cells in the memory.

Figure 2:
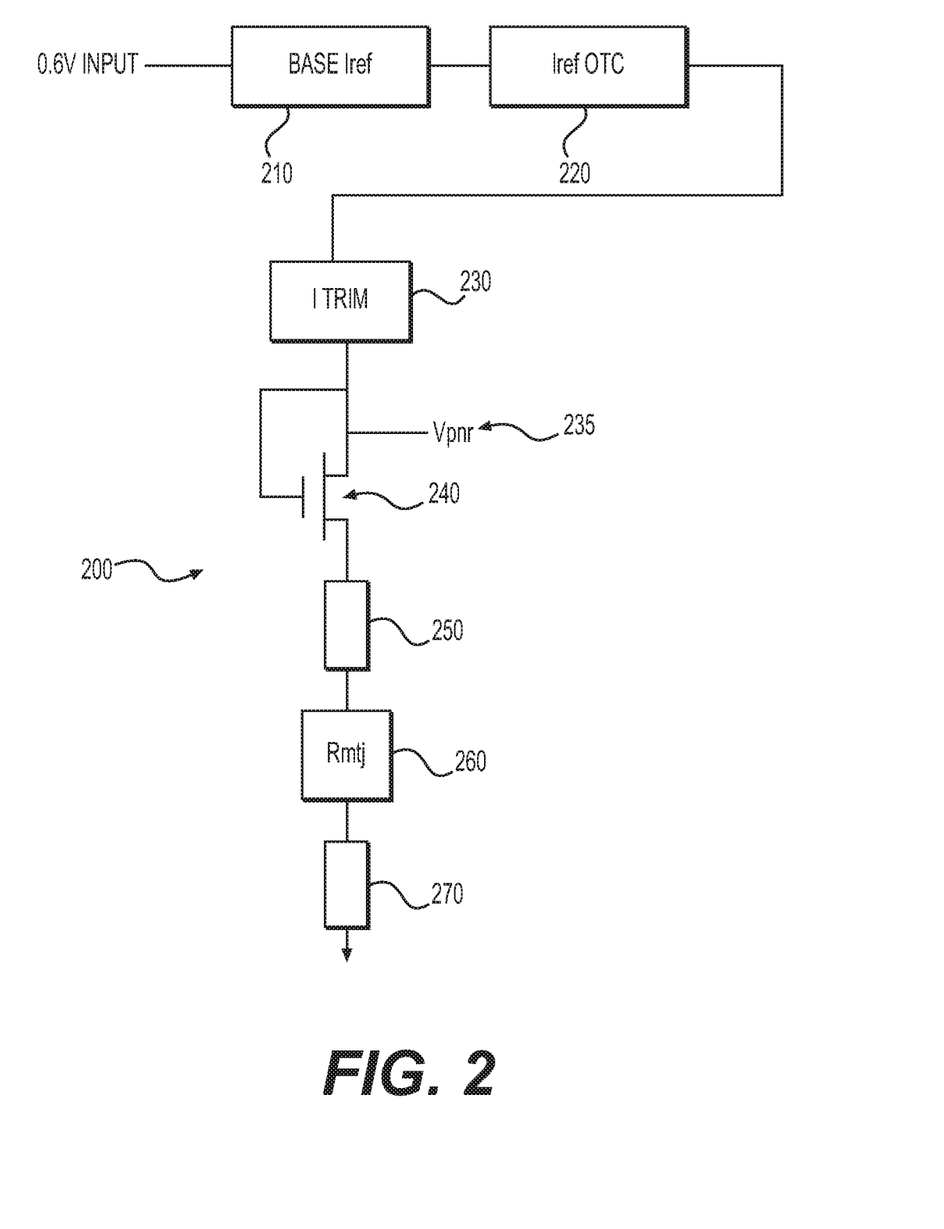
FIG. 2 depicts a schematic diagram of a bias voltage generation circuit, according to another aspect of the present disclosure.

FIG. 2 illustrates a "feed forward" circuit 200 corresponding to one embodiment of the present invention in which the bias voltage Vpnr 235 to be applied to the gate of an NMOS-follower transistor 240 is generated. The circuit of FIG. 2 does not have the closed loop regulation with feedback as in FIG. 1 and therefore is referred to as a "feed forward" circuit. The voltage Vpnr 235 is generated by passing a current that is controllable or "trimmable" through the series connected components 250, 260, and 270. In some embodiments, each of the components 250, 260, 270, is a replica component corresponding to the circuit components present in the sensing circuitry used to read and/or write operations in the magnetic memory. For example, the Rmtj component 260 is a dummy (replica) magnetic tunnel junction in some embodiments, whereas in other embodiments component 260 is simply a resistor having a value that mimics the resistance of a magnetic tunnel junction in the memory array. Similarly, components 250 and 270 mimic circuitry used for column selection or other aspects of the sensing circuitry used to read data from the memory. A high level perspective on such additional circuitry is shown in FIG. 3, where select circuits 31-34 corresponds to column selection circuits, and where the particular path through those column selection circuits includes one or more components that are mimicked in the components 250 and 270 shown in FIG. 2.

As further illustrated in FIG. 2, transistor 240 may be a diode-connected NMOS device. This diode-connected NMOS device allows for tracking of variations of the threshold voltage (Vt) for NMOS devices used in the memory. Current references 210 and 220 provide a reference current that is adjustable by I Trim 230, which is programmable and allows the amount of current sent through components 240, 250, 260, and 270 to be controlled.

The configuration shown in FIG. 2 generates bias voltage Vpnr 235, which corresponds to the appropriate bias voltage to be applied to an NMOS-follower circuit during a read operation where the resistance through the magnetic tunnel junction is sensed. Looking at FIG. 3, the bias voltage may be applied to driver 51, which would include an NMOS-follower circuit that generates the appropriate voltage to be applied at one end of magnetic tunnel junctions 20-22 included in memory cells 10-12 during a sensing operation. Note that during such a sensing operation, a greater voltage is applied on the end of the memory cell closest to the driver 51, whereas a lesser voltage is applied at the other end of the memory cell closest to driver 52. In some embodiments, during a read operation, driver 52 may simply include a connection to ground.

Figure 3:
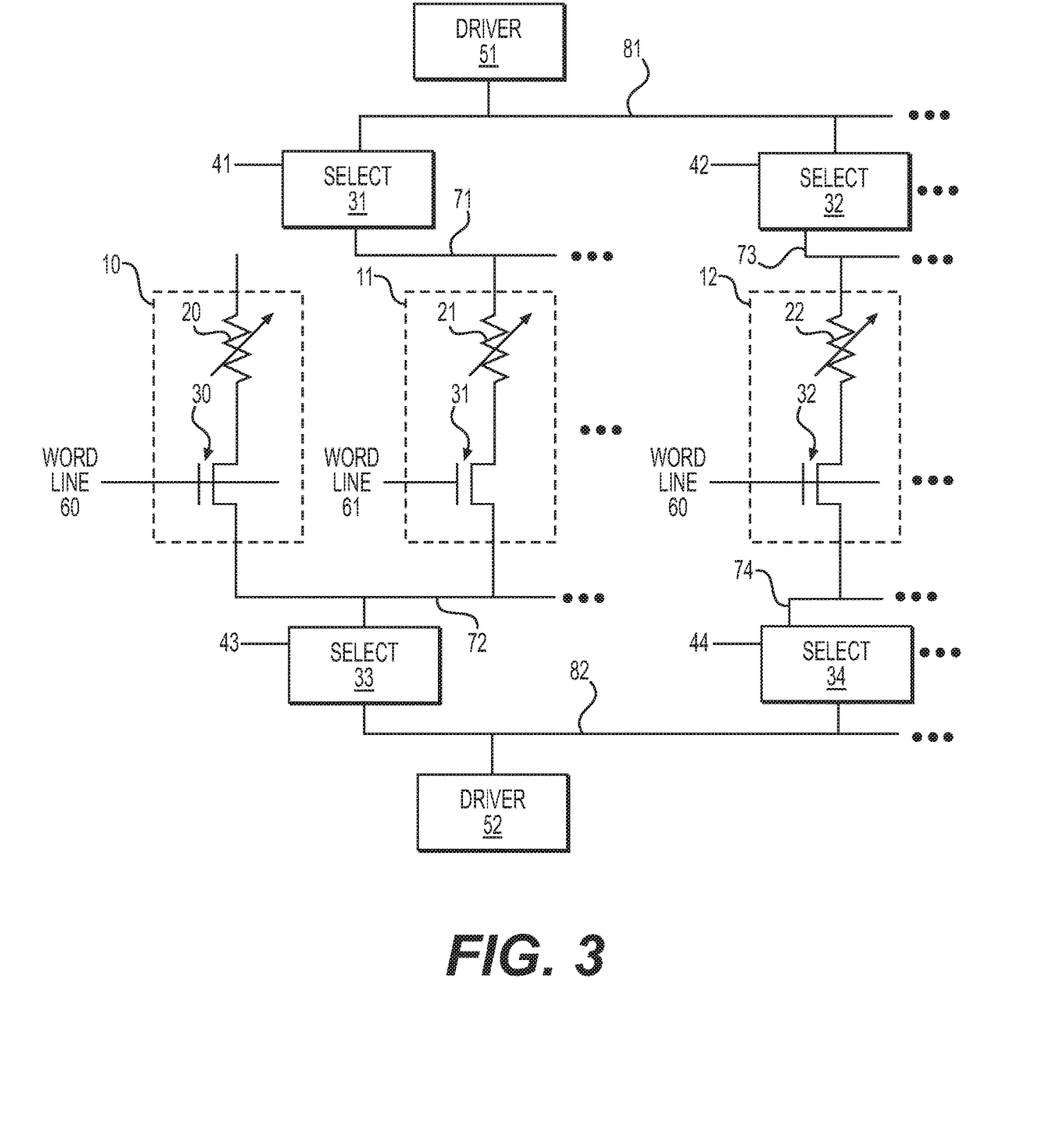
FIG. 3 depicts a block diagram of a magnetic memory device that includes memory cells and bias voltage drivers, according to another aspect of the present disclosure.

FIG. 3 illustrates a portion of a magnetic memory that includes a plurality of magnetic memory cells 10-12. Notably, FIG. 3 only shows a few memory cells 10-12 in order to illustrate the concepts of the embodiments described as a memory array can include hundreds, thousands, hundreds of thousands or more memory cells. Each of the magnetic memory cells 10-12 includes a magnetic tunnel junction 20-22 coupled in series with corresponding selection circuits 30-32. As shown in FIG. 3, the ends of memory cells 10 and 11 are coupled to the same common lines 71 and 72. In some embodiments, common lines 71 and 72 may be a bit line and a source line. Memory cell 12 may be coupled to a different set of common lines 73 and 74. In order to access memory cells 10 and 11 for sensing or write operations, line drivers 51 and 52 may drive voltages on lines 81 and 82, respectively, where lines 81 and 82 may include multiple access points for the selection circuits 31-34. Selection circuits 31-34 may be configured to selectively couple the voltages on lines 81 and 82 at their corresponding access points to common lines 71-74. Thus, each of the selection circuits 31-34 can selectively pass a driving voltage by one of the line drivers 51, 52 that is present at its corresponding access point to a corresponding common line 71-74. The control of each selection circuit 31-34 may be based on a corresponding selection input signal 41-44 provided to each selection circuit.

As is further illustrated in FIG. 3, multiple memory cells 10-12 may be coupled to each of the common lines 71-74, and word lines 60 and 61 allow for selectivity between memory cells coupled to the same set of common lines. For example, word lines 60 and 61 select between memory cells 10 and 11. Thus, if the select inputs 41 and 43 of selection circuits 31 and 33 are driven such that the voltage sourced by line drivers 51 and 52 is passed through to lines 71 and 72, word lines 60 and 61 will determine if current flows through each of memory cells 10 and 11, respectively. If word line 60 is asserted high and word line 61 is de-asserted low, current will flow through memory cell 10 but will not flow through memory cell 11. Thus, the access to an individual memory cell is based on the selection inputs, the voltages applied by the line drivers, and the voltages driven on the word lines.

Assuming memory cell 10 is selected by the selection circuits and word lines for a sensing operation used in conjunction with a read operation, line driver 51 applies a high voltage while line driver 52 applies a low-voltage such that a sense current flows vertically through memory cell 10 when word line 60 is asserted. With the sense current flowing through memory cell 10, the resistance 20 of the memory cell can be detected. As noted above, writing to a spin torque magnetic memory cell relies on currents flowing in different directions through the memory cell in order to write the desired state to the memory cell. Thus, for a down current write, line driver 51 will assert a higher voltage than the line driver 52 such that downward current results. Conversely, for an up current write, line driver 52 will assert a higher voltage than line driver 51 such that a vertical current in the upward direction flows through the memory cell 10. As also noted above, the currents associated with write operations in spin torque magnetic memory cells are typically much larger than the current used for a sensing operation that is used to determine the resistance of the memory cell.

As can be seen in FIG. 3, line drivers 51 and 52 drive lines 81 and 82, respectively. Selection circuits 31-34 enable the voltages at the corresponding access points for the common lines 71-74 to be selectively applied to the common lines (e.g. bit lines and source lines) within the memory array. Thus, access point selection circuits 31-34 provide column selection within the memory array in order to allow shared line drivers to apply certain voltages only to particular bit lines and/or source lines within the memory array.

While FIG. 3 shows two line drivers 51 and 52 that are each able to supply either a high voltage or a low voltage depending upon the operation being performed, in other embodiments, separate high and low line drivers are provided that can either source or sink current to be sent through the memory cells. In such an embodiment, a first common line that connects to one end of the memory cell, can be driven by either of a high voltage line driver or low voltage line driver based on the selection signals applied to selection circuits. In some embodiments the common line is a bit line or a source line. Another common line at the other end of the memory cell can also be driven by a similar set of high and low drivers. Notably, different driver arrangements can be used for different ends of the memory devices depending on the specific characteristics of the memory cells, the arrangement of the memory cells, and the access circuitry used in selecting the memory cells for access.

For write operations that store a particular state in the magnetic tunnel junctions, a larger amount of current needs to be driven through the magnetic tunnel junction in order to cause the free portion of the magnetic tunnel junction to be forced to the desired state. As such, the voltage differential applied across the magnetic tunnel junction is greater during write operations than during the sensing operations corresponding to a read. In order to support the higher voltage differential, the drivers 51 and 52 shown in FIG. 3 are supplied with different bias voltages during such write operations. Note that two different directions of current are used through the magnetic tunnel junction to achieve the desired state of the free portion of the magnetic tunnel junction. For example, a down current write applies a greater voltage at the end of the magnetic tunnel junction corresponding to driver 51, while applying a lesser voltage at the other end of the magnetic tunnel junction such that current flows in the downward direction through, for example, magnetic tunnel junction 20. If the opposite state is to be stored in the magnetic tunnel junction 20, a greater voltage is applied at the end of the magnetic tunnel junction corresponding to driver 52 whereas a lesser voltage is applied at the opposite end of the magnetic tunnel junction 20.

In order to generate the appropriate bias voltages for the NMOS-follower circuits during write operations, additional versions of the circuitry shown in FIG. 2 may be included in the magnetic memory in order to generate bias voltages for each of the up current and down current write operations. For example, in order to generate the bias voltage for a down current write operation (Vpnd), a circuit with the same general structure as shown in FIG. 2 may be used, where the current supplied through the bias circuit corresponds to the desired current through the magnetic tunnel junction for the down current write operation. The resulting voltage at the gate of transistor 240 provides the appropriate bias voltage that can be distributed to the driver circuit in the memory in order to appropriately bias the NMOS-follower circuits therein. Note that for a down current write operation, the components mimicked in the circuitry of FIG. 2 may be the same as for a read sensing operations when the current flow during such a read sensing operation is in the same direction as in a down current write operation.

In the case of generating the bias voltage for an up current write operation (Vpnu), the current flowing through the magnetic tunnel junction will flow through the selection transistor (e.g. selection transistor 30) before flowing through magnetic tunnel junction 20. As such, the set of components included in the biasing circuit similar to that of FIG. 2 for an up current write operation includes the various components in the appropriate order in the series connection such that the circuitry in the array used for an up current write operation is adequately mimicked. For example, the correct ordering may require swapping the placement of components 270 and 250 such that current flowing downward in the bias circuit for an up current write operation encounters component 270 before component 250.

Thus, three separate biasing circuits with the general structure as illustrated in FIG. 2 may be included on each memory device in order to generate the different NMOS-follower bias voltages corresponding to read sensing operations, down current write operations, and up current write operations. Notably, similar circuitry can be used for determining an appropriate sense amplifier offset voltage or any other sensing bias voltage in the memory.

A capacitor can be added to the signal line carrying the bias voltage (e.g. Vpnr) generated by the circuit shown in FIG. 2, or a sample and hold circuit can be constructed in order to hold the bias voltage so that current only needs to flow through the replica circuit occasionally. Indeed, there may be enough capacitance on the line based on its connections to many NMOS-follower circuits to support the retention of the bias voltage for a significant amount of time. In some embodiments, the bias system can be time multiplexed such that the current sources only provide current through the replica circuit intermittently and the resulting bias voltage generated is maintained and applied between refreshes of the bias voltage when current flow is enabled. For example, in a clocked system, the bias voltage could be regenerated every so many (e.g. 10, 20, 50) clock cycles. In other embodiments, enable switches can be included in the current generation circuits 210, 220, and 230 such that the current in those blocks is selectively enabled and disabled to conserve power.

In other embodiments, a feedback bias system such as that shown in FIG. 1 may also be included in the memory, where the feedback bias system is only occasionally enabled in order to compensate for effects (e.g. temperature) not tracked by the feed forward bias system shown in FIG. 2. As a specific example, for every 10 refresh cycles corresponding to regeneration of the bias voltage in the circuit of FIG. 2, a test replica and comparator circuit such as that shown in FIG. 1 is activated to move the trimmable values (e.g. programmed current corresponding to I Trim 230) to compensate for the slowly varying effect of temperature change. Such a system may use a built in self test (BIST) algorithm/implementation on the memory device. This additional 10-to-1 adjustment may allow for a replica array that compensates for various slow-moving effects (e.g., process, temperature, etc.), but where the current draw of the feedback clock circuitry is averaged away and appears as basically a clocked feed-forward mock structure.

In systems where the bias voltage for the different operations is only occasionally refreshed, a single I Trim block 230, which may be a current steering digital to analog converter (DAC), may be used for all of the bias voltage generation circuits. For example, a high-speed current steering DAC may be used to sequentially generate the different bias voltages. In such an example, the appropriate down current write bias voltage may be first generated by selectively connecting the shared DAC to the appropriate circuitry for mimicking the down current write conditions. Following generation of the down current bias voltage, the DAC is disconnected from the circuitry for the down current write and then reconnected to circuitry corresponding to mimicking the conditions for up current write bias voltage generation. After generation of the up current write bias voltage, the same DAC could be used for read sensing bias voltage generation, where the cycle would then start again by refreshing the down current bias voltage. The sharing of the current steering DAC saves on chip area and can help spread out current spikes over time as the individual bias circuits are only enabled occasionally.

Figure 4:
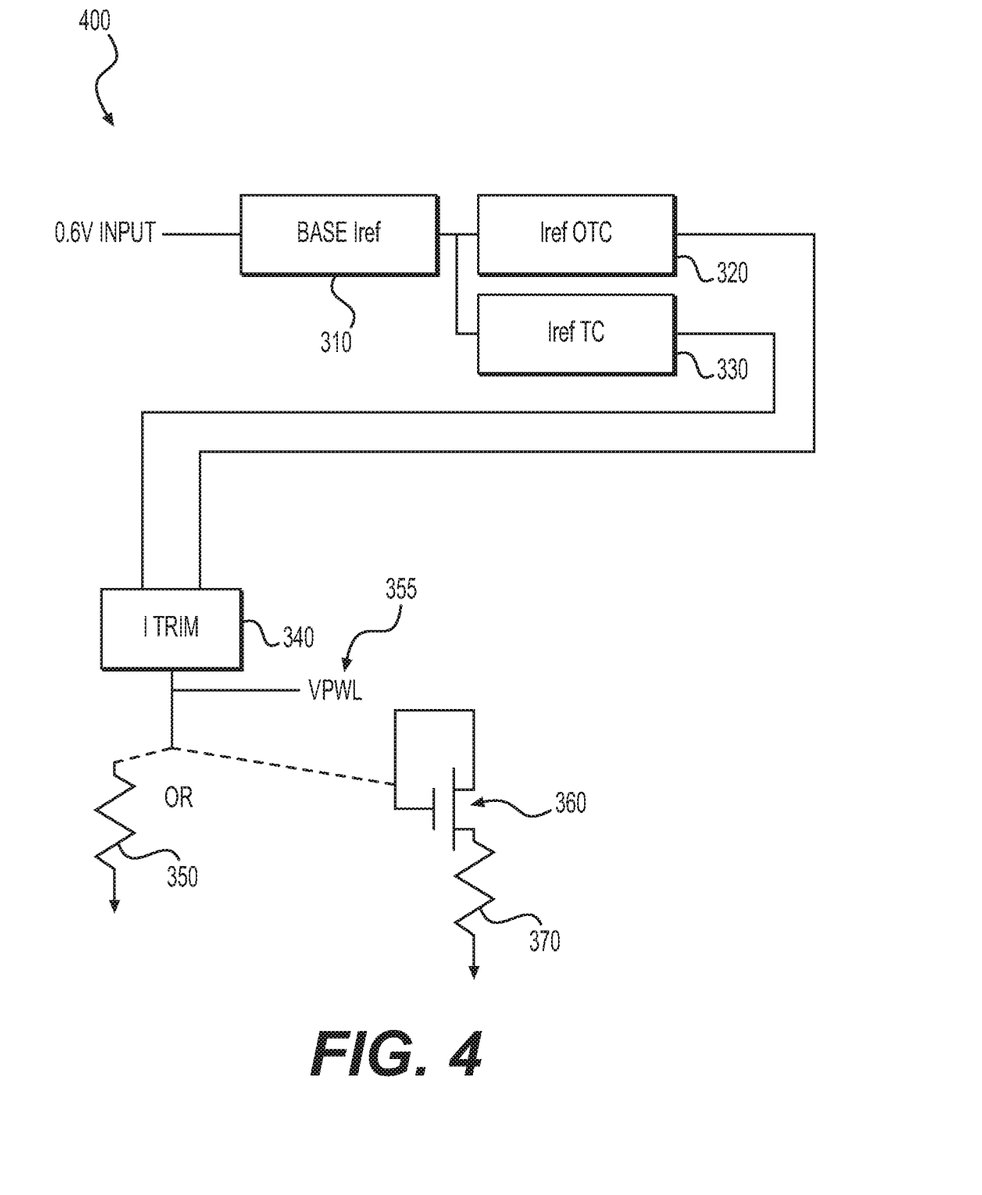
FIG. 4 depicts a schematic diagram of a bias voltage generation circuit, according to another aspect of the present disclosure.

FIG. 4 illustrates a similar bias voltage generation circuit 400 for generating word line voltages that may be applied to the word lines (e.g. word lines 60 and 61 in FIG. 3) in a magnetic memory device. Such a circuit may be used to generate a base word line voltage that may also be referred to as a reliable word line voltage. The global word line voltage distributed to the memory may be generated by adding a threshold voltage corresponding to each of the selection transistors to the reliable word line voltage. In the voltage generation circuit of FIG. 4, either a single resistor 350 or a diode-connected NMOS transistor 360 coupled to a resistor 370 may be used in the generation of the reliable word line voltage, Vpwl 355. The I Trim current component 340 allows for programmability of the bias voltage, and current generation devices 310, 320, and 330 may be configured to provide current to the I Trim block 340. Similar to the bias generation circuits described in FIG. 2, the bias voltage generated in FIG. 4 ma be generated constantly, or may be generated occasionally and stored on a capacitor (or other voltage retention circuit).

Figure 5:
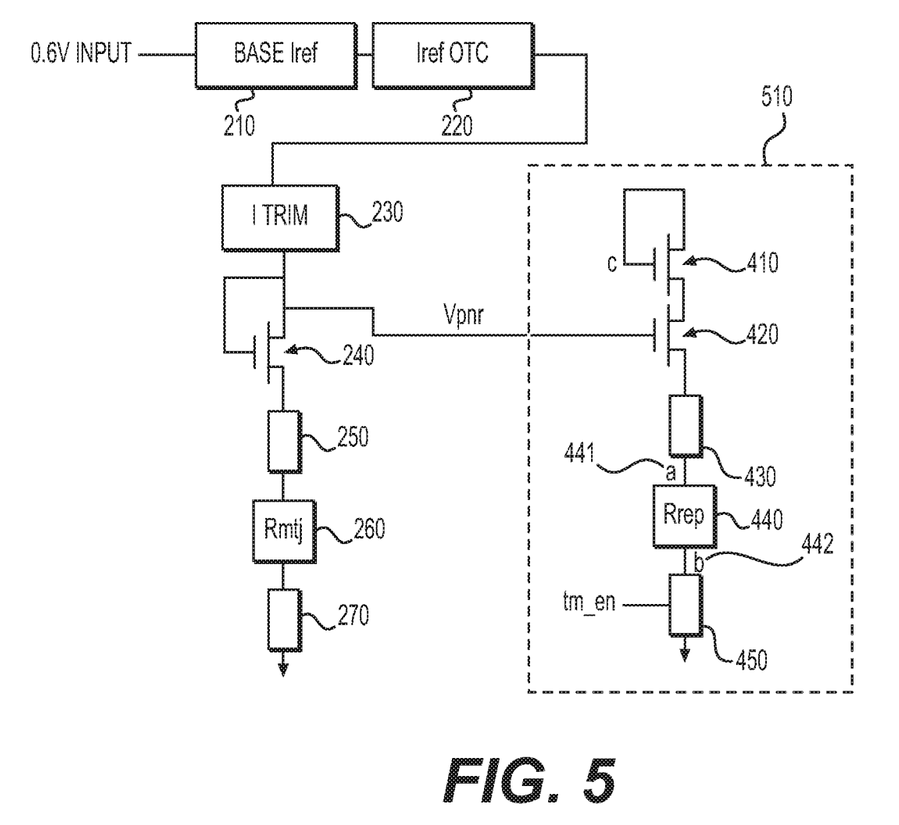
FIG. 5 depicts a block diagram of a bias voltage generation circuit, according to another aspect of the present disclosure.

FIG. 5 illustrates another embodiment that includes a bias generation circuit similar to that shown in FIG. 2, along with a replica sensing circuit 510 that may include replica devices 410, 420, 430, 440, and 450. As shown in FIG. 5, device 430 may include circuitry to mimic the column select transistor and word line transistor for replica sensing circuit 510. Similarly, device 450 mimics a pulldown transistor that grounds the bottom end of the Rrep (e.g. representative resistor) device 440, where device 440 mimics the magnetic tunnel junction resistance. A test enable signal provided to device 450 may be sourced from, for example, a pin (e.g. tm_en). When testing is enabled, the bias voltage Vpnr may be applied to the gate of the transistor 420 in the replica sensing circuit 510, and the voltage across device 440 can be measured across node a 441 and node b 442. Testing can be done across a range of temperatures and supply voltages in order to determine the actual voltage that is applied across device 440 in different conditions. Device 440 may be a programmable, or trimmable, resistance, where specific resistances corresponding to magnetic tunnel junctions storing a high state or a low state are selectable. In other words, the resistance can correspond to a magnetic tunnel junction with the free portion either parallel or antiparallel to the fixed portion.

By using a built in self test (BIST) engine or other testing routine, the appropriate settings for the I Trim block 230 in the bias generation circuit can be determined. For example, such a determination can be made during probe testing while the memory is still included on a wafer. Comparators and logic or a small microcontroller can be used to determine the appropriate settings for the I Trim block 230 based on the voltage measured across node a 441 and node b 442. Thus, the system of FIG. 5 may be used in testing operations for configuring the appropriate current to be sent through the bias circuit, as shown in FIG. 2, and achieving the most accurate bias voltages for the various memory operations.

In an alternate embodiment, a magnetic memory may include: a first common line having a first end and a second end; a second common line having a first end and a second end; a memory cell that includes: a select device having a first electrode and a second electrode, wherein the first electrode is connected to the first end of the first common line; and a magnetic memory element coupled in series between the second electrode of the select device and the first end of the second common line; a first voltage driver, wherein the first voltage driver is coupled to the second end of the second common line, and a bias voltage generation circuit, wherein the bias voltage generation circuit is configured to provide a first bias voltage to the first voltage driver, and wherein the first voltage driver is configured to provide a first driving voltage to the second end of the second common line during an access operation.

In an another alternate embodiment, the magnetic memory may include a magnetic tunnel junction. The magnetic memory may further include a first common line configured as a source line, and a second common line configured as a bit line. A bias voltage generation circuit may include a diode-connected NMOS device. The bias voltage generation circuit may include a current reference device, wherein the current reference device includes a trimming device for controlling an amount of current flowing through the current reference device. The bias voltage generation circuit may be configured to generate a first bias voltage by passing a current through a series of replica devices. A second voltage driver may be coupled to the second end of the first common line. The second voltage driver is configured to provide a second driving voltage to the first end of the first common line during an access operation. The access operation includes one of a read and write operation.

In another alternate embodiment, a magnetic memory may include a first common line having a first end and a second end; a second common line having a first end and a second end; a memory cell that includes: a select device having a first electrode and a second electrode, wherein the first electrode is connected to the first end of the first common line; and a magnetic memory element coupled in series between the second electrode of the select device and the first end of the second common line; a first voltage driver, wherein the first voltage driver is coupled to the second end of the second common line; a second voltage driver, wherein the second voltage driver is coupled to the second end of the first common line; a first bias voltage generation circuit; and a second bias voltage generation circuit, wherein the first bias voltage generation circuit is configured to provide a first bias voltage to the first voltage driver during an access operation, and the second bias voltage generation circuit is configured to provide a second bias voltage to the second voltage driver during the access operation.

In another alternate embodiment, the magnetic memory may further include a magnetic tunnel junction; the first common line is a source line; the second common line is a bit line; the first bias voltage generation circuit includes a first diode-connected NMOS device; the first bias voltage generation circuit includes a first current reference device, wherein the first current reference device includes a first trimming device for controlling an amount of current flowing through the first current reference device; the first bias voltage generation circuit is configured to generate the first bias voltage by passing a current through a series of replica devices; wherein the first voltage driver is configured to generate a first driving voltage based on the first bias voltage; the second voltage driver is configured to generate a second driving voltage based on the second bias voltage; the access operation includes one of a read and write operation The foregoing description of the inventions has been described for purposes of clarity and understanding. It is not intended to limit the inventions to the precise form disclosed. Various modifications may be possible within the scope and equivalence of the application.

We claim:

1. A magnetic memory, comprising:
   a first common line having a first end and a second end;
   a second common line having a first end and a second end;
   a memory cell that includes:
   a select device having a first electrode and a second electrode, wherein the first electrode is connected to the first end of the first common line; and
   a magnetic memory element coupled in series between the second electrode of the select device and the first end of the second common line;
   a first voltage driver, wherein the first voltage driver is coupled to the second end of the second common line, and
   a bias voltage generation circuit, wherein the bias voltage generation circuit is configured to provide a first bias voltage to the first voltage driver and includes a current reference device, wherein the current reference device includes a trimming device for controlling an amount of current flowing through the current reference device, and wherein the first voltage driver is configured to provide a first driving voltage to the second end of the second common line during an access operation.

2. The magnetic memory of claim 1, wherein the magnetic memory element is a magnetic tunnel junction.

3. The magnetic memory of claim 1, wherein the first common line is a source line.

4. The magnetic memory of claim 1, wherein the second common line is a bit line.

5. The magnetic memory of claim 1, wherein the bias voltage generation circuit includes a diode-connected NMOS device.

6. The magnetic memory of claim 1, wherein the bias voltage generation circuit is configured to generate the first bias voltage by passing a current through a series of replica devices.

7. The magnetic memory of claim 1, further comprising a second voltage driver, wherein the second voltage driver is coupled to the second end of the first common line.

8. The magnetic memory of claim 7, wherein the second voltage driver is configured to provide a second driving voltage to the first end of the first common line during the access operation.

9. The magnetic memory of claim 8, wherein the access operation includes one of a read and write operation.

10. A magnetic memory, comprising:
a first common line having a first end and a second end;
a second common line having a first end and a second end;
a memory cell that includes:
a select device having a first electrode and a second electrode, wherein the first electrode is connected to the first end of the first common line; and
a magnetic memory element coupled in series between the second electrode of the select device and the first end of the second common line;
a first voltage driver, wherein the first voltage driver is coupled to the second end of the second common line;
a second voltage driver, wherein the second voltage driver is coupled to the second end of the first common line;
a first bias voltage generation circuit; and
a second bias voltage generation circuit, wherein the first bias voltage generation circuit is configured to provide a first bias voltage to the first voltage driver during an access operation and includes a first current reference device, wherein the first current reference device includes a first trimming device for controlling an amount of current flowing through the first current reference device, and the second bias voltage generation circuit is configured to provide a second bias voltage to the second voltage driver during the access operation.

11. The magnetic memory of claim 10, wherein the magnetic memory element is a magnetic tunnel junction.

12. The magnetic memory of claim 10, wherein the first common line is a source line.

13. The magnetic memory of claim 10, wherein the second common line is a bit line.

14. The magnetic memory of claim 10, wherein the first bias voltage generation circuit includes a first diode-connected NMOS device.

15. The magnetic memory of claim 10, wherein the first bias voltage generation circuit is configured to generate the first bias voltage by passing a current through a series of replica devices.

16. The magnetic memory of claim 10, wherein the first voltage driver is configured to generate a first driving voltage based on the first bias voltage.

17. The magnetic memory of claim 10, wherein the second voltage driver is configured to generate a second driving voltage based on the second bias voltage.

18. The magnetic memory of claim 10, wherein the access operation includes one of a read and write operation.

* * * * *